US007429970B2

(12) United States Patent
Tsai et al.

(10) Patent No.: US 7,429,970 B2
(45) Date of Patent: Sep. 30, 2008

(54) METHOD FOR TESTING DRIVE CIRCUIT, TESTING DEVICE AND DISPLAY DEVICE

(75) Inventors: Shan-Hung Tsai, Taichung (TW); Ming-Hsien Sun, Shinjuang (TW)

(73) Assignee: TPO Displays Corp., Miao-Li County (TW)

( * ) Notice: Subject to any disclaimer, the term of this patent is extended or adjusted under 35 U.S.C. 154(b) by 668 days.

(21) Appl. No.: 11/032,788

(22) Filed: Jan. 11, 2005

(65) Prior Publication Data

US 2006/0156143 A1 Jul. 13, 2006

(51) Int. Cl.
*G09G 3/36* (2006.01)
*G01R 31/00* (2006.01)

(52) U.S. Cl. .......................... 345/87; 345/90; 345/93; 345/98; 345/100; 345/904; 324/770

(58) Field of Classification Search .................. 345/55, 345/84, 87, 90, 93, 904, 98, 100, 204; 324/537, 324/770
See application file for complete search history.

(56) References Cited

U.S. PATENT DOCUMENTS

| | | | | | |
|---|---|---|---|---|---|
| 5,774,100 | A * | 6/1998 | Aoki et al. | 345/87 |
| 5,909,035 | A * | 6/1999 | Kim | 257/59 |
| 5,936,687 | A * | 8/1999 | Lee | 349/40 |
| 6,246,074 | B1 * | 6/2001 | Kim et al. | 257/48 |
| 6,281,701 | B1 * | 8/2001 | Yang et al. | 324/770 |
| 6,392,719 | B2 * | 5/2002 | Kim | 349/40 |
| 6,801,265 | B2 * | 10/2004 | Choi et al. | 349/40 |
| 7,123,043 | B2 * | 10/2006 | Tsai et al. | 324/770 |
| 7,268,754 | B2 * | 9/2007 | Tsai et al. | 345/82 |
| 2003/0222220 | A1 * | 12/2003 | Enachescu et al. | 250/341.6 |

FOREIGN PATENT DOCUMENTS

| | | |
|---|---|---|
| JP | 5005866 | 1/1993 |
| JP | 5341320 | 12/1993 |
| JP | 10003098 | 1/1998 |

* cited by examiner

*Primary Examiner*—My-Chau T Tran
(74) *Attorney, Agent, or Firm*—MH2 Technology Law Group LLP

(57) ABSTRACT

A method of testing a drive circuit including a scan line drive circuit and a data line drive circuit for driving a display is disclosed. The display may include a plurality of scan lines and a plurality of data lines, each of said scan lines including an initial terminal coupled to said scan line drive circuit, each of said data lines including an initial terminal coupled to said data line drive circuit. The method includes: coupling each of said scan lines and each of said data lines to a first testing pad and a second testing pad respectively; sending a first testing signal to an input terminal of said scan line drive circuit and sending a second testing signal to an input terminal of said data line drive circuit; and testing at said first testing pad and said second testing pad respectively.

16 Claims, 2 Drawing Sheets

METHOD FOR TESTING DRIVE CIRCUIT, TESTING DEVICE AND DISPLAY DEVICE

FIELD OF THE INVENTION

This disclosure relates to a method of testing a drive circuit and a testing device using the same. The disclosure relates to a method of testing a drive circuit, such as testing for whether or not all devices of the drive circuit work properly. Moreover, the disclosure relates to a testing device and a display using the same.

BACKGROUND OF THE INVENTION

The earliest developed video images can be seen in documentary film. After the invention of the cathode ray tube (CRT), the commercial television (TV) set was being installed in every house. As the technology advanced, the application of the CRT was extended to the desktop monitor for the computer so that the CRT dominated in the display markets for years. However, one disadvantage of the CRT display is that it emits harmful radiation. In addition, CRT displays typically are large devices due to the internal electron gun. Thus, CRT displays cannot be compact and/or lightweight.

Due to these and other drawbacks, the flat panel display, such as a liquid crystal display (LCD), a field emission display (FED), an organic light emitting diode (OLED), and a plasma display panel, was developed. Among these flat panel displays, the LCD has the advantage of being compact in size and lightweight. Further, LCDs can be made in a variety of sizes, and thus the trend has been to replace the CRT display with the LCD. Further, the LCD can also provide high portability and thus can support wireless communication and network technology.

LCD's can be operated with a thin film transistor (TFT). TFT for use with LCDs can include amorphous silicon LCDs and polycrystalline silicon (polysilicon) LCDs. Recently, a low temperature polysilicon (LTPS)-LCD also has been developed. Because the drive circuit of the LTPS-LCD is located outside the pixel structure, it is important to test whether all devices of the drive work properly.

FIG. 1 is a circuit diagram of the pixel array and the drive circuit in accordance with a conventional drive circuit. As shown in FIG. 1, the drive circuit includes a scan line drive circuit 102 and a data line drive circuit 104. The pixel array 106 includes a plurality of scan lines 108, a plurality of data lines 110 and a pre-charging circuit 112. The scan line drive circuit 102 includes shift registers 114 and 116, a gate 118, and a buffer circuit (not shown). The data line drive circuit 104 includes shift registers 120, 122, and 124, a phase arrangement circuit (PAC) 126, a gate 128 and a horizontal switch 130.

The conventional method of testing a drive circuit will be described with reference to FIG. 1. First, the output terminal of the scan line drive circuit 102 (i.e., the output terminal of the shift register 116) is connected to a pad 132. For the scan line drive circuit 102, the pulse signal 136 is sent to the input terminal of the scan line drive circuit 102 (i.e., the input terminal of the shift register 114). Next, the pad 132 connected to the output terminal of the scan line drive circuit 102 (i.e., the output terminal of the shift register 116) is checked to determine whether there is an output signal. An output signal detected at the pad 132 means that the scan line drive circuit 102 is working properly. However, failure to detect an ouput signal indicates that the scan line drive circuit 102 is damaged. Likewise, the output terminal of the data line drive circuit 104 (i.e., the output terminal of the shift register 124) is connected to a pad 134. For the data line drive circuit 104, the pulse signal 138 is sent to the input terminal of the data line drive circuit 104 (i.e., the input terminal of the shift register 120). Next, the pad 134 connected to the output terminal of the data line drive circuit 104 (i.e., the output terminal of the shift register 124) is checked to determine whether there is an output signal. An output signal is detected at the pad 134, means that the data line drive circuit 104 is working properly. In light of the above, the conventional method for testing the drive circuit has the following drawbacks.

Test results showing that the scan line drive circuit 102 and the data line drive circuit 104 works properly only means that the shift registers 114-116 and 120-124, respectively, work properly. However, this does not guarantee that the other devices of the scan line drive circuit 102 and the data line drive circuit 104 work properly.

Further, test results showing that the scan line drive circuit 102 and the data line drive circuit 104 are damaged do not indicate which of the device(s) of the scan line drive circuit 102 and the data line drive circuit 104 is/are damaged.

Moreover, because the conventional method of testing the drive circuit cannot test all of the devices of the drive circuits, there may be some unknown line defects or point defects that go undetected when testing the pixels.

SUMMARY OF THE INVENTION

In accordance with the invention, there is provided a method of testing a drive circuit. The drive circuit can comprise a scan line drive circuit and a data line drive circuit for driving a display, where the display comprises a plurality of scan lines and a plurality of data lines, and where each of the scan lines comprises an initial terminal coupled to said scan line drive circuit. Further, each of the data lines comprises an initial terminal coupled to the data line drive circuit. Accordingly, the method comprises coupling each of the scan lines and each of the data lines to a first testing pad and a second testing pad respectively and sending a first testing signal to an input terminal of the scan line drive circuit and sending a second testing signal to an input terminal of the data line drive circuit. The first testing signal can be sent to the first testing pad via the scan line drive circuit and the scan lines and the second testing signal being sent to the second testing pad via the data line drive circuit and the data lines. The method also comprises testing at the first testing pad and the second testing pad respectively.

According to an embodiment, there is provided a testing device of a drive circuit, the drive circuit comprising a scan line drive circuit and a data line drive circuit for driving a display. The display can comprise a plurality of scan lines and a plurality of data lines, where each of the scan lines can comprise an initial terminal coupled to the scan line drive circuit, where each of the data lines comprises an initial terminal coupled to the data line drive circuit. According to various embodiments, the testing device comprises a first testing pad coupled to the scan lines, wherein an input terminal of the scan line drive circuit is adopted for receiving a first testing signal, where the first testing signal is sent to the first testing pad for testing via the scan line drive circuit and the scan lines. Further a second testing pad can be coupled to the data lines, wherein an input terminal of the data line drive circuit can be adopted for receiving a second testing signal, where the second testing signal is sent to the second testing pad for testing via the data line drive circuit and the data lines.

Additional advantages of the disclosure will be set forth in part in the description which follows, and in part will be obvious from the description, or may be learned by practice. The advantages of the disclosure will be realized and attained by means of the elements and combinations particularly pointed out in the appended claims.

It is to be understood that both the foregoing general description and the following detailed description are exemplary and explanatory only and are not restrictive of the disclosure, as claimed.

BRIEF DESCRIPTION OF THE DRAWINGS

The accompanying drawings, which are incorporated in and constitute a part of this specification, illustrate one (several) embodiment(s) of the disclosure and together with the description, serve to explain the principles of the disclosure.

DESCRIPTION OF THE EMBODIMENTS

Figure 1:
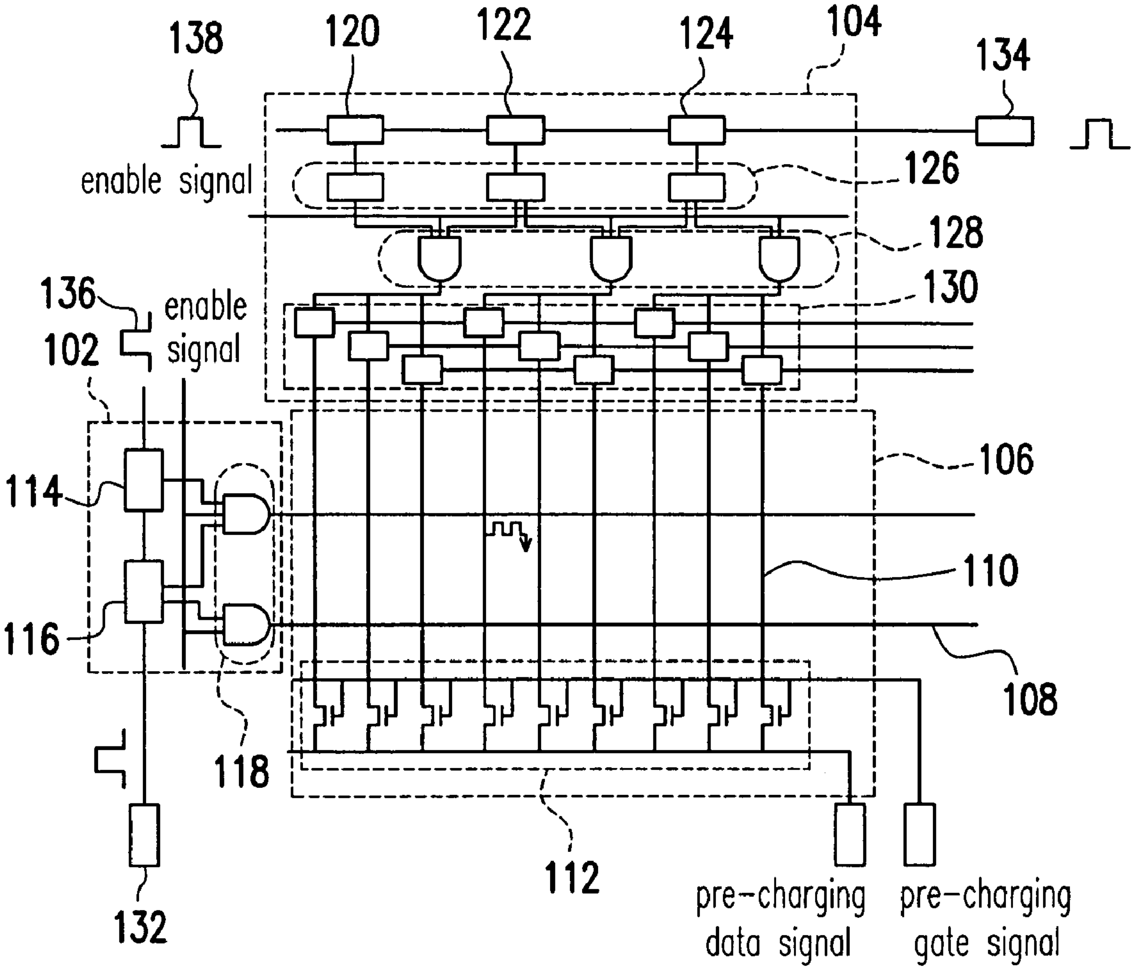
FIG. 1 (PRIOR ART)
FIG. 1 is a circuit diagram of the pixel array and the drive circuit utilized in a conventional method for testing a drive circuit.

Reference will now be made in detail to the present embodiment(s) (exemplary embodiments) of the disclosure, an example(s) of which is (are) illustrated in the accompanying drawings. Wherever possible, the same reference numbers will be used throughout the drawings to refer to the same or like parts.

According to an embodiment, each scan line and data line may be coupled to a first testing pad and a second testing pad, respectively. Next, a first testing signal and a second testing signal may be sent to the input terminal of the scan line drive circuit and the input terminal of the data line drive circuit, respectively. Thereafter, the test may be performed on the first testing pad and the second testing pad to determine whether all of the devices of the scan line drive circuit and the data line drive circuit work properly.

According to an embodiment, a drive circuit comprising a scan line drive circuit and a data line drive circuit for driving a display may be provided. The display may comprise, for example, a plurality of scan lines and a plurality of data lines, wherein each of the plurality of scan lines may comprise an initial terminal coupled to the scan line drive circuit, each of the plurality of data lines may comprise an initial terminal coupled to the data line drive circuit. According to an embodiment, each of the plurality of scan lines may be coupled to a first testing pad and each of the plurality of data lines may be coupled to a second testing pad. Next, a first testing signal may be sent to an input terminal of the scan line drive circuit and a second testing signal may be sent to an input terminal of the data line drive circuit. For example, the first testing signal may be sent to the first testing pad via the scan line drive circuit and each of the plurality of scan lines, and the second testing signal may be sent to the second testing pad via the data line drive circuit and each of the plurality of data lines. Thereafter, the first testing pad and the second testing pad may be tested.

According to another embodiment, a testing device of a drive circuit may be provided. The drive circuit may comprise, for example, a scan line drive circuit and a data line drive circuit for driving a display. The display may comprise a plurality of scan lines and a plurality of data lines, wherein each scan line comprising an initial terminal may be coupled to the scan line drive circuit, and each data line comprising an initial terminal may be coupled to the data line drive circuit. The testing device may comprise a first testing pad and a second testing pad. The first testing pad may be coupled to the scan lines, wherein an input terminal of the scan line drive circuit may be adopted for receiving a first testing signal. The first testing signal may be sent to the first testing pad for testing via the scan line drive circuit and each of the scan lines. The second testing pad may be coupled to the data lines, wherein an input terminal of the data line drive circuit may be adopted for receiving a second testing signal. The second testing signal may be sent to the second testing pad for testing via the data line drive circuit and each data line.

According to still another embodiment, a display device may be provided. The display device may comprise a display, a drive circuit comprising a scan line drive circuit and a data line drive circuit for driving the display, and a testing device. The display may comprise a plurality of scan lines and a plurality of data line. Each scan line may comprise an initial terminal coupled to the scan line drive circuit, and each data line may comprise an initial terminal coupled to the data line drive circuit. The testing device may comprise a first testing pad and a second testing pad. The first testing pad may be coupled to the scan lines, wherein an input terminal of the scan line drive circuit may be adopted for receiving a first testing signal. The first testing signal may be sent to the first testing pad for testing via the scan line drive circuit and each of the scan lines. The second testing pad may be coupled to the data lines, wherein an input terminal of the data line drive circuit may be adopted for receiving a second testing signal. The second testing signal may be sent to the second testing pad for testing via the data line drive circuit and each data line.

In an embodiment, when each of the plurality of scan lines is not coupled to a circuit, a diode may be disposed between the first testing pad and each of the plurality of scan lines. The diode may comprise an anode coupled to each of the plurality of scan lines and a cathode may be coupled to the first testing pad.

In an embodiment, when each of the plurality of scan lines is coupled to a circuit, a terminal of the circuit may be coupled to the first testing pad.

In an embodiment, when each of the plurality of data lines is not coupled to a circuit, a diode may be disposed between the second testing pad and each of the plurality of data lines. The diode may comprise an anode coupled to each of the plurality of data lines and a cathode may be coupled to the second testing pad.

In an embodiment, when each of the plurality of data lines is coupled to a circuit, a terminal of the circuit may be coupled to the second testing pad.

In an embodiment, the step of testing at the first testing pad and the second testing pad, respectively, may comprise measuring a current at the first testing pad and measuring a current at the second testing pad with a current meter. The step of testing at the first testing pad and the second testing pad, respectively, may comprise measuring a voltage at the first testing pad and measuring a voltage at the second testing pad with a voltage meter.

In an embodiment, each of the first testing signal and the second testing signal may be a pulse signal, a voltage signal or a current signal.

In an embodiment, the display may be a liquid crystal display.

In light of the above, according to an embodiment of the present invention, each scan line and data line may be coupled to the first testing pad and the second testing pad respectively. Next, the first testing signal and the second testing signal may be sent to the input terminal of the scan line drive circuit and the input terminal of the data line drive circuit, respectively. Thereafter the test may be performed at the first testing pad and the second testing pad to determine whether all of the devices of the scan line drive circuit and the data line drive circuit work properly.

Figure 2:
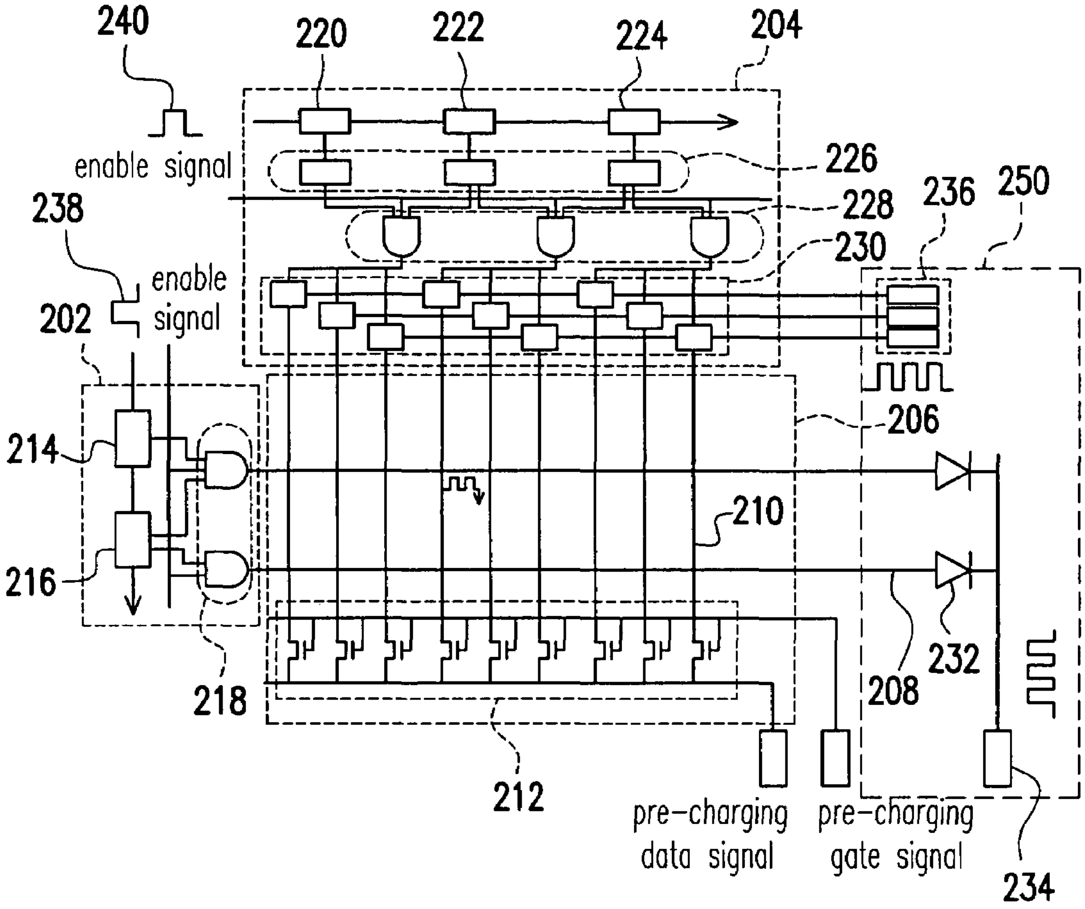
FIG. 2 is a circuit diagram of a pixel array and a drive circuit utilized in a method for testing the drive circuit according to an embodiment of the present disclosure.

FIG. 2 is a circuit diagram of the pixel array and a drive circuit utilized in a method of testing the drive circuit according to an embodiment of the present disclosure. Referring to FIG. 2, the drive circuit may include the scan line drive circuit 202 and the data line drive circuit 204 to drive the display (e.g., the LCD). The display may include the pixel array 206. The pixel array 206 may include a plurality of scan lines 208, a plurality of data lines 210, and a pre-charging circuit 212. The scan line drive circuit 202 may include at least one shift register 214 and 216, a gate 218, and a buffer circuit (not shown). The data line drive circuit 204 may include at least one shift register 220, 222 and 224, a phase arrangement circuit (PAC) 226, a gate 228, and a horizontal switch 230. Each of at least one scan line 208 comprises an initial terminal coupled to the scan line drive circuit 202; and each of at least one data line 210 comprises an initial terminal coupled to the data line drive circuit 204.

According to an embodiment, the method of testing the drive circuit may be described with reference to FIG. 2. First, each scan line and data line may be coupled to a first testing pad and a second testing pad, respectively. For the scan line, when each scan line is not coupled to a circuit, a diode may be disposed between the first testing pad and each scan line. The diode may have an anode coupled to each scan line and a cathode may be coupled to the first testing pad. When each scan line is coupled to a circuit, a terminal of the circuit may be coupled to the first testing pad. For the data line, when each data line is not coupled to a circuit, a diode may be disposed between the second testing pad and each data line. The diode may comprise an anode coupled to each data line and a cathode coupled to the second testing pad. When each data line is coupled to a circuit, a terminal of the circuit may be coupled to the second testing pad. As an example, in FIG. 2, because each scan line 208 is not coupled to a circuit, each scan line 208 is coupled to the testing pad 234 via the diode 232. Further, because each data line 210 is coupled to the pre-charging circuit 212, the drain of the pre-charging circuit 212 is coupled to the testing pad 236 via the horizontal switch 230. In addition, it should be noted that the connection between the scan lines, the data lines and the testing pads shown FIG. 2 is one example of the present invention, and therefore should not be interpreted to limit the scope of the present invention.

Thereafter, a first testing signal 238 and a second testing signal 240 may be sent to the input terminal of the scan line drive circuit 202 (i.e., the input terminal of the shift register 214) and the input terminal of the data line drive circuit 204 (i.e., the input terminal of the shift register 220), respectively. The testing signal 238 may be sent to the testing pad 234 via the scan line drive circuit 202 and each scan line 208. The testing signal 240 may be sent to the testing pad 236 via the data line drive circuit 204 and each data line 210. In addition, the testing signals 238 and 240 can be pulse signals, voltage signals or current signals.

Thereafter, the test may be performed at the first testing pad 234 and the second testing pad 236 to determine whether all of the devices of the scan line drive circuit 202 and the data line drive circuit 204 work properly based on the output signals obtained at the first testing pad 234 and the second testing pad 236. In addition, a current may be measured by using a current meter at the first testing pad 234 and the second testing pad 236. On the other hand, a voltage may be measured using a voltage meter at the first testing pad 234 and the second testing pad 236.

In another embodiment, a testing device 250 for a drive circuit may be provided. The drive circuit may comprise, for example, a scan line drive circuit 202 and a data line drive circuit 204 for driving a display 206. The display 206 may comprise a plurality of scan lines 208 and a plurality of data lines 210, wherein each scan line 208 may comprise an initial terminal coupled to the scan line drive circuit 202, and each data line 210 may comprise an initial terminal coupled to the data line drive circuit 204. The testing device 250 may comprise at least one testing pad 234 and 236. The testing pad 234 may be coupled to the scan lines 208, wherein an input terminal of the scan line drive circuit 202 may be adopted for receiving testing signal 238. The testing signal 238 may be sent to the testing pad 234 for testing via the scan line drive circuit 202 and each scan line 208. The testing pad 236 may be coupled to the data lines 210, wherein an input terminal of the data line drive circuit 204 may be adopted for receiving testing signal 240. The testing signal 240 may be sent to the testing pad 236 for testing via the data line drive circuit 204 and each data line 210.

In still another embodiment, a display device as shown in FIG. 2 may be provided. The display device may comprise a display 206, a drive circuit comprising a scan line drive circuit 202, and a data line drive circuit 204 for driving the display 206, and a testing device 250. The display 206 may comprise a plurality of scan lines and a plurality of data line. Each scan line 208 may comprise an initial terminal coupled to the scan line drive circuit 202, and each data line 210 may comprise an initial terminal coupled to the data line drive circuit 204. The testing device 250 may comprise testing pads 234 and 236. The testing pad 234 may be coupled to the scan lines 208, wherein an input terminal of the scan line drive circuit 202 may be adopted for receiving testing signal 238. The testing signal 238 may be sent to the testing pad 234 for testing via the scan line drive circuit 202 and each scan line 208. The testing pad 236 may be coupled to the data lines 210, wherein an input terminal of the data line drive circuit 204 may be adopted for receiving a testing signal 240. The testing signal 240 may be sent to the testing pad 236 for testing via the data line drive circuit 204 and each data line 210.

In light of the above, the present disclosure may have at least one of the following advantages.

1. The method may be capable of checking whether all devices of the scan line drive circuit and the data line drive circuit work properly.

2. The testing method may be capable of determining which of the damaged device(s) of the scan line drive circuit and the data line drive circuit may be damaged.

3. Because the method may be capable of testing all of the devices of the drive circuit, the line defects or point defects can also determined when testing the pixels.

The above description provides a full and complete description of the disclosed embodiments. Various modifications, alternate construction, and equivalent may be made by those skilled in the art without changing the scope or spirit of the invention. Accordingly, the above description and illustrations should not be construed as limiting the scope of the disclosure which is defined by the following claims.

Other embodiments of the disclosure will be apparent to those skilled in the art from consideration of the specification. It is intended that the specification and examples be considered as exemplary only, with a true scope and spirit of the disclosure being indicated by the following claims.

What is claimed is:

1. A method of testing a drive circuit, said drive circuit comprising a scan line drive circuit and a data line drive circuit for driving a display, said display comprising a plurality of scan lines and a plurality of data lines, each of said scan lines is coupled to said scan line drive circuit, each of said data lines is coupled to said data line drive circuit, said method comprising:

coupling each of said scan lines and each of said data lines to a first testing pad and a second testing pad respectively;

sending a first testing signal to said scan line drive circuit and sending a second testing signal to said data line drive circuit, said first testing signal being sent to said first testing pad via said scan line drive circuit and said scan lines, said second testing signal being sent to said second testing pad via said data line drive circuit and said data lines; and testing at said first testing pad and said second testing pad respectively.

2. The method of claim 1, wherein a diode is disposed between said first testing pad and at least one of said scan lines.

3. The method of claim 2, wherein said diode comprises an anode coupled to the scan line and a cathode coupled to said first testing pad.

4. The method of claim 1, wherein a diode is disposed between said second testing pad and at least one of said data lines.

5. The method of claim 4, wherein said diode comprises an anode coupled to the data line and a cathode coupled to said second testing pad.

6. The method of claim 1, wherein said step of testing comprises measuring a current at said first testing pad and said second testing pad using a current meter.

7. The method of claim 1, wherein said step of testing comprises measuring a voltage at said first testing pad and said second testing pad using a voltage meter.

8. The method of claim 1, wherein said first testing signal and said second testing signal comprise a pulse signal.

9. The method of claim 1, wherein said first testing signal and said second testing signal comprise a voltage signal.

10. The method of claim 1, wherein said first testing signal and said second testing signal comprise a current signal.

11. The method of claim 1, wherein said display comprises a liquid crystal display.

12. A testing device of a drive circuit, said drive circuit comprising a scan line drive circuit and a data line drive circuit for driving a display, said display comprising a plurality of scan lines and a plurality of data lines, each of said scan lines is coupled to said scan line drive circuit, each of said data lines is coupled to said data line drive circuit, said testing device comprising:

a first testing pad coupled to said scan lines, wherein said scan line drive circuit is adopted for receiving a first testing signal, and said first testing signal is sent to said first testing pad for testing via said scan line drive circuit and said scan lines; and a second testing pad coupled to said data lines, wherein said data line drive circuit is adopted for receiving a second testing signal, and said second testing signal is sent to said second testing pad for testing via said data line drive circuit and said data lines.

13. The testing device of claim 12, further comprising a diode disposed between said first testing pad and at least one of said scan lines.

14. The testing device of claim 12, further comprising a diode disposed between said second testing pad and at least one of said data lines.

15. A display device, comprising:

a display comprising a plurality of scan lines and a plurality of data lines;

a drive circuit comprising a scan line drive circuit and a data line drive circuit for driving said display, wherein each of said scan lines is coupled to said scan line drive circuit, and each of said data lines is coupled to said data line drive circuit; and a testing device comprising:

a first testing pad coupled to said scan lines, wherein said scan line drive circuit is adopted for receiving a first testing signal, and said first testing signal is sent to said first testing pad for testing via said scan line drive circuit and said scan lines; and a second testing pad coupled to said data lines, wherein said data line drive circuit is adopted for receiving a second testing signal, and said second testing signal is sent to said second testing pad for testing via said data line drive circuit and said data lines.

16. The display device of claim 15, wherein the display is a liquid crystal display.

* * * * *